(12) United States Patent
Domes

(10) Patent No.: US 8,471,600 B2
(45) Date of Patent: Jun. 25, 2013

(54) DETECTION OF THE ZERO CROSSING OF THE LOAD CURRENT IN A SEMICONDUCTOR DEVICE

(75) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/249,604

(22) Filed: Sep. 30, 2011

(65) Prior Publication Data

US 2013/0082741 A1    Apr. 4, 2013

(51) Int. Cl.
*H03K 5/153* (2006.01)

(52) U.S. Cl.
USPC ............................................................ 327/79

(58) Field of Classification Search
USPC ...................................... 327/78, 79
See application file for complete search history.

(56) References Cited

U.S. PATENT DOCUMENTS

2007/0231973 A1    10/2007  Ruething et al.
2010/0079192 A1*    4/2010  Strzalkowski ................ 327/419

FOREIGN PATENT DOCUMENTS

DE    102009001029 A1    8/2010

OTHER PUBLICATIONS

Domes, D. "Detection of the Conduction State of an RC-IGBT", Co-pending U.S. Appl. No. 12/943,079, filed Nov. 10, 2010.

* cited by examiner

*Primary Examiner* — Lincoln Donovan
*Assistant Examiner* — Sibin Chen
(74) *Attorney, Agent, or Firm* — Murphy, Bilak & Homiller, PLLC

(57) ABSTRACT

A circuit arrangement includes a reverse conducting transistor having a gate electrode and a load current path between an emitter and collector electrode. The transistor is configured to allow for conducting a load current in a forward direction and in a reverse direction through the load current path and activated or deactivated by a respective signal at the gate electrode. The circuit arrangement further includes a gate control unit and a monitoring unit. The gate control unit is connected to the gate electrode and configured to deactivate the transistor or prevent an activation of the transistor via the gate electrode when the transistor is in a reverse conducting state. The monitoring unit is configured to detect a sudden rise of a collector-emitter voltage of the reverse conducting transistor which occurs, when the load current crosses zero, while the transistor is deactivated or activation is prevented by the gate control unit.

13 Claims, 8 Drawing Sheets

DETECTION OF THE ZERO CROSSING OF THE LOAD CURRENT IN A SEMICONDUCTOR DEVICE

TECHNICAL FIELD

The present disclosure relates to a circuit arrangement and a method for detecting the zero crossing of a load current passing through a semiconductor device, in particular a reverse conducting transistor such as insulated-gate bipolar transistors.

BACKGROUND

Insulated-gate bipolar transistors (IGBT) are used, for example, in inverter circuits to regulate inductive loads such as electric machines. In the inverter circuits, the IGBTs are connected in parallel to a free-wheeling diode to allow for a bi-directional current, which becomes necessary if IGBTs are to be applied, for example, in connection with inductive loads. The application of parallel free-wheeling diodes, however, involves numerous disadvantages. For instance, the IGBT housing must be designed so as to accommodate both the IGBT body and the separate free-wheeling diode and the bonding of the two components is complex and costly.

To overcome these disadvantages, reverse conducting IGBTs (so called RC-IGBTs) have become popular, such as those disclosed in U.S. Patent Application Publication No. 2007/0231973A1, in which an IGBT and a free-wheeling diode are monolithically formed as one simple semiconductor component. The p-doped collector zone is locally disrupted by incisions, where n-doped semiconductor material contacts the collector metallization, resulting in a so-called PIN-electrode structure between the emitter structure, the lightly doped drift zone and the p-doped material in the MOS-channel zone.

The conducting state of a conventional free-wheeling diode connected antiparallel to an IGBT does not depend on the conduction state of the IGBT, whereas the intrinsic free-wheeling diode of an RC-IGBT is influenced by the conduction state of the MOS-channel zone of the RC-IGBT. That is, if the RC-IGBT is triggered via its gate electrode during its reverse conduction state, the MOS-channel is conductive. Since the MOS-channel allows for a bi-directional current, electrons in the reverse conduction path may follow an additional current path in case of a triggered gate electrode, in the course of which the forward voltage drop may be substantially increased in the PIN-diode structure as not all of the electrons contribute to the flooding of the PIN-diode, which is undesirable in most cases.

In German Patent Application Publication DE 102009001029A1, a control method and a corresponding circuit structure is disclosed that overcomes the problem described hereinbefore, the control method involving a method for detecting the current direction in an RC-IGBT. One disadvantage of this method may be that at least one (or a plurality of serial) diode(s) of high blocking capability is/are necessary, these diodes being costly and needing a large space within a power electronic arrangement due to the required electric creepage distances.

U.S. patent application Ser. No. 12/943,079 discloses a circuit arrangement and a corresponding control method for overcoming the problem described hereinbefore and for preventing the RC-IGBT from being switched on via its gate electrode while in its reverse conducting state, the control method involving a method for detecting the current direction in an RC-IGBT. This method is based on detecting the charge current transferred through the gate connector of an RC-IGBT if the device is switched passively. A passive switching event occurs, if the RC-IGBT goes from forward blocking into reverse conducting mode, or vice versa, without an active switching event of its dedicated gate drive.

The fact, however, that passive switching events can only take place at the beginning of the dead-time in a half bridge configuration poses a problem. If a passive switching event occurs and the RC-IGBT is therefore prevented from being switched on and a zero crossing of the load current occurs while the RC-IGBT is still switched off, this results in highly distorted current waveforms and makes real zero crossing impossible.

There is a general need to overcome or to at least to mitigate the problems discussed above. There is also a need to provide a circuit arrangement and a corresponding method to detect the zero crossing of the load current and switch on the RC-IGBT if a zero crossing occurs.

SUMMARY

In accordance with one embodiment, a circuit arrangement includes: a reverse conducting transistor configured to allow for conducting a load current in a forward direction and in a reverse direction, the transistor having a load current path and a gate electrode; a gate control unit connected to the gate electrode and configured to deactivate the transistor or to prevent an activation of the transistor via its gate electrode when the transistor is in a reverse conducting state; a monitoring unit configured to detect a sudden rise of the collector-emitter voltage of the reverse conducting transistor, which occurs when the load current through the transistor crosses zero, while the transistor is deactivated or deactivation is prevented by the gate control unit.

In accordance with another embodiment, a method is disclosed for detecting the zero crossing of the load current of a transistor, while the transistor is in its reverse conducting state and is deactivated or activation is prevented by a gate control unit.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and description. The components in the figures are not necessarily to scale, instead emphasis being placed upon illustrating the principles of the invention. In the figures, like reference numerals designate corresponding parts. In the drawings.

DETAILED DESCRIPTION

In many applications in which transistors come to use, it is possible to use not only one type of transistor. It is often possible e.g. to use field-effect transistors (FETs) or insulated-gate bipolar transistors (IGBTs). IGBTs for example are usually operated with a free-wheeling diode connected anti-parallel to their load current paths. So-called reverse conducting IGBTs (RC-IGBTs) have an intrinsic reverse diode so that a separate free-wheeling diode is no longer required. Such RC-IGBTs may also be employed instead of IGBTs, FETs or other transistors.

Figure 1:
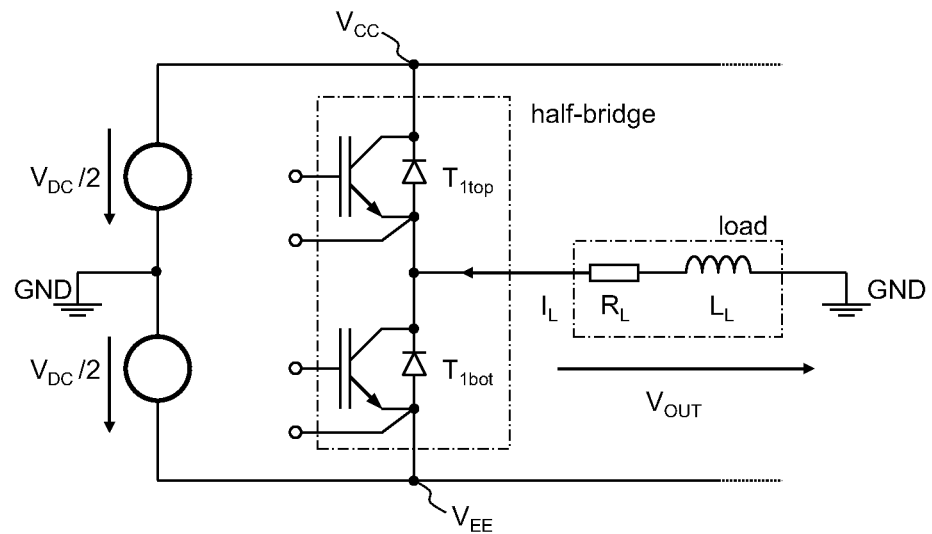
FIG. 1 is a schematic diagram illustrating an RC-IGBT half-bridge circuit arrangement connected to a load impedance including an inductor.

RC-IGBTs, for example, may be used in (power) converters in which an IGBT half-bridge is used to control each phase-current. FIG. 1 schematically illustrates such a half-bridge. The IGBT half-bridge may include two n-channel IGBTs $T_{1TOP}$, $T_{1BOT}$ connected in series, wherein the operating voltage $V_{DC}$ (intermediate voltage or DC-link voltage) is applied across the half bridge, i.e. between the collector of the high-side transistor $T_{1TOP}$ and the emitter of the low-side transistor $T_{1BOT}$. The collector potential of the high-side transistor $T_{1TOP}$ is herein referred to as $V_{CC}$, whereas the emitter potential of the bottom transistor $T_{1BOT}$ is herein referred to as $V_{EE}$. The common circuit node of transistors $T_{1TOP}$ and $T_{1BOT}$ is the output node of the half-bridge that provides the output current $i_{OUT}$ (also called phase-current) to a connected load impedance. In most cases, the load impedance includes an inductive load. Commonly, the DC link voltage is symmetrical with respect to a reference potential GND; i.e. $V_{CC}=V_{DC}/2$ and $V_{EE}=-V_{DC}/2$. In the present case, the load is connected between the output of the half-bridge and the reference potential GND.

A gate control unit 10 is provided for each transistor $T_{1TOP}$, $T_{1BOT}$ to control the output current $I_L$ (half-bridge output current). The gate control unit 10 may include a gate switching unit 102 (cf. FIG. 3 which is described further below) which may be configured to achieve a certain time response of the current $I_L$ (i.e. edge-shaped current steps) and/or to prevent the half-bridge from being short-circuited. Both of the gate control units 10 are provided with a (binary) gate control signal $S_{1TOP}$ and $S_{1BOT}$, each indicating the desired conduction state of the corresponding transistor $T_{1TOP}$ or $T_{1BOT}$. A converter half-bridge including gate control units 10 is illustrated in FIG. 2.

Figure 2:
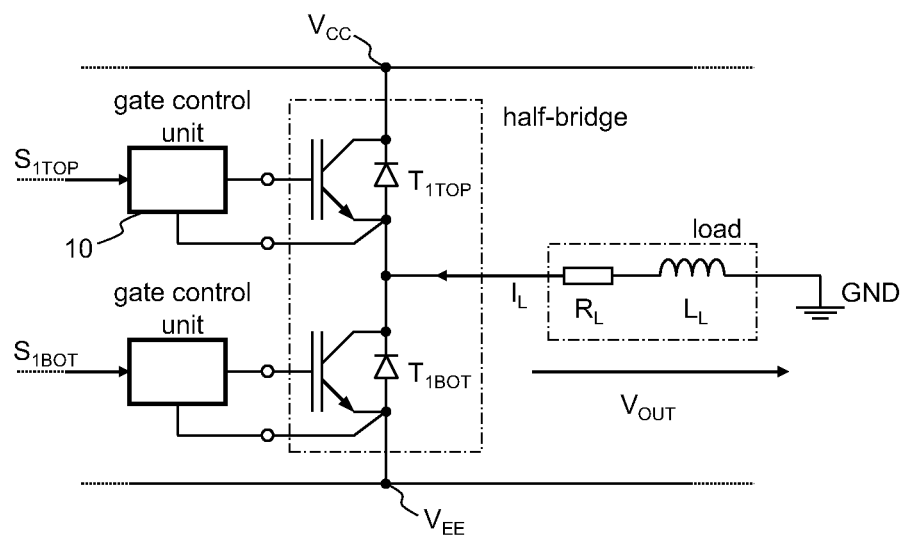
FIG. 2 is a schematic diagram illustrating of the RC-IGBT half-bridge of FIG. 1 including a gate control unit for each transistor.

A half-bridge, e.g. the half-bridge illustrated in FIG. 2, can have four possible switching states. Depending on the control signals $S_{1TOP}$ and $S_{1BOT}$ and the direction of the output current $I_L$ (load current), which may be determined by an inductive load, the output potential of the half-bridge output node takes either (approximately) the value $V_{EE}=-V_{DC}/2$ or $V_{CC}=V_{DC}/2$.

Considering a first state in which both RC-IGBT control signals $S_{1TOP}$, $S_{1BOT}$ switch the corresponding transistor to its off state ($S_{1TOP}=0$, $S_{1BOT}=0$), the output current $I_L$ can only flow through the intrinsic reverse diode of either the transistor $T_{1TOP}$ or the transistor $T_{1BOT}$ in accordance with the direction of the output current $I_L$. That is, the output current $I_L$ either flows through the intrinsic free-wheeling diode of the top transistor $T_{1TOP}$ or through the free-wheeling diode of bottom transistor. Consequently, the output potential either is $V_{EE}$ (in case of a negative output current $I_L$) or $V_{CC}$ (in case of a positive output phase current $I_L$), this being a mere approximation as the forward voltage drop of the intrinsic diode is neglected in the above consideration.

If in a second state only the transistor $T_{1BOT}$ is switched into its conduction state, also called on-state, ($S_{1TOP}=0$, $S_{1BOT}=1$), independent of the direction of the output current $I_L$, the output potential is approximately equal to $V_{EE}$. In case of a positive output current $I_L$ (a positive current flows in the direction as indicated in FIG. 2 by the arrow referring to the output current $I_L$) the transistor $T_{1BOT}$ is in its forward conducting state, whereas, in case of a negative output current, transistor $T_{1BOT}$ is in its reverse conducting state. A third switching state, in which only transistor $T_{1BOT}$ is switched into its conduction state ($S_{1TOP}=1$, $S_{1BOT}=0$), is complementary to the second switching state described above. Therefore, in this third state, the output potential is approximately equal to $V_{CC}$.

A fourth state refers to a state in which both transistors $T_{1BOT}$ and $T_{1TOP}$ are switched into their forward conducting states ($S_{1TOP}=S_{1BOT}=1$). However, in such a state the DC link voltage $V_{DC}$ would be short-circuited, which may result in malfunctions or even in the destruction of the half-bridge. The gate driver circuit should therefore be configured to prevent such a half-bridge shoot-through.

In the second and third switching states, where only either transistor $T_{1TOP}$ or transistor $T_{1BOT}$ is switched on, the above-mentioned problem may occur, when a transistor is activated (i.e. $S_{1TOP}=1$ or, respectively, $S_{1BOT}=1$) while being in a reverse conducting state. In this case the voltage drop across its load-path would increase considerably, inevitably resulting in increased losses and consequently in significant heat generation. More precisely, this problem may occur in the second state in case of a negative output current $i_{OUT}$, and in the third state in case of a positive output current $i_{OUT}$.

Figure 3:
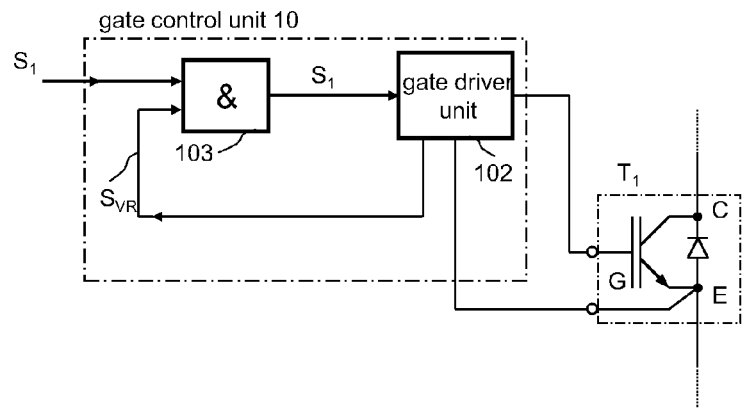
FIG. 3 is a schematic diagram illustrating an RC-IGBT with a gate control unit monitoring the conducting state of the corresponding RC-IGBT and switching the transistor depending on its conducting state.

FIG. 3 illustrates a circuit arrangement that includes a reverse conducting IGBT $T_1$ capable of conducting via its load path a load current in forward direction (via a MOS channel) as well as in reverse direction (via the intrinsic anti-parallel reverse diode).

The transistor $T_1$ includes a gate electrode G connected to a gate control unit 10, that switches the forward current path of the IGBT on and off in accordance with a corresponding control signal $S_1$. The gate control unit 10 includes a gate switching unit 102 coupled to the gate electrode G, the gate control unit 10 being configured to supply appropriate gate control signals to the gate G in accordance with the control signal $S_1$, thus switching the forward current path of the transistor into an on-state or an off-state.

The gate control signal supplied to the gate electrode G may be a suitable gate-emitter voltage $V_{GE}$ or a gate current $i_{GATE}$, depending on whether the transistor $T_1$ is to be current-driven or voltage-driven.

There are numerous alternatives for blocking or blanking the signal $S_1$ so as to prevent a switch-on of the transistor T1, even when the signal $S_1$ is at a high-level. For example, the signal $S_1$ is passed through an AND-gate 103 before being admitted to the gate driver unit 102 which generates the gate control signal. A current direction signal $S_{VR}$ is generated by the gate driver unit 102 and further components (which shall be described herein-after) and applied to an input of the AND-gate 103. Assuming that $S_{VR}=0$, if the transistor $T_1$ is in its reverse conducting state, the signal $S_1$ will be blanked before reaching the gate driver unit 102. Thus, the signal $S_1$ is prevented from activating the transistor $T_1$ while the transistor is in its reverse conducting state. Further assuming that $S_{VR}=1$, if the transistor is not in its reverse conducting state (on-state or blocked), the signal $S_1$ is not blanked and is passed on to the gate switching unit 102, which may then generate an appropriate gate control signal switching the transistor to its on-state.

There are parasitic capacitances considered inherent to every electronic switch, thus also inherent to an RC-IGBT as used in the embodiment introduced in FIGS. 1 to 3. The gate-collector capacitance $C_{GC}$ and gate-emitter capacitance $C_{GE}$ are illustrated in the circuit diagram of FIG. 5. However, as compared to the gate-collector capacitance $C_{GC}$ the gate-emitter capacitance $C_{GE}$ can be neglected in the following considerations. The mentioned capacitances, in particular, the gate-collector capacitance $C_{GC}$, are charged or discharged by a gate current $i_{GATE}$ in the gate electrode G. The capacitance $C_{GC}$ is charged or discharged upon a change of the direction of the voltage drop across the load path (collector-emitter path) of the RC-IGBT. The change of the direction of the voltage drop is caused by a change of the load current of the IGBT. The charging of the capacitance $C_{GC}$ implies a displacement current resulting in a corresponding gate current $i_{GATE}$ which may be utilized to determine the conduction state of the corresponding RC-IGBT.

If the current $I_L$ through the diode of the RC-IGBT is positive but decreases over time and crosses zero at one point, the diode is not able to block immediately. This is because there are carriers stored in the diode. For a short time the load current is already negative but still flows though the transistor. When the stored carriers are fully removed from the diode, the device can no longer conduct current. At the time instant when the current path through this diode is no longer available, the current has to find a different current path. In a half-bridge circuit the current commutates to the diode of the opposite transistor (switch) in such a case. Therefore, the collector-emitter voltage of the transistor which is related to the diode which conducts no current anymore, suddenly rises up to the level of $V_{DC}$. If the collector-emitter voltage rises, the collector-gate voltage also rises, resulting in a charge current of the parasitic capacitance $C_{CG}$.

Figure 4:
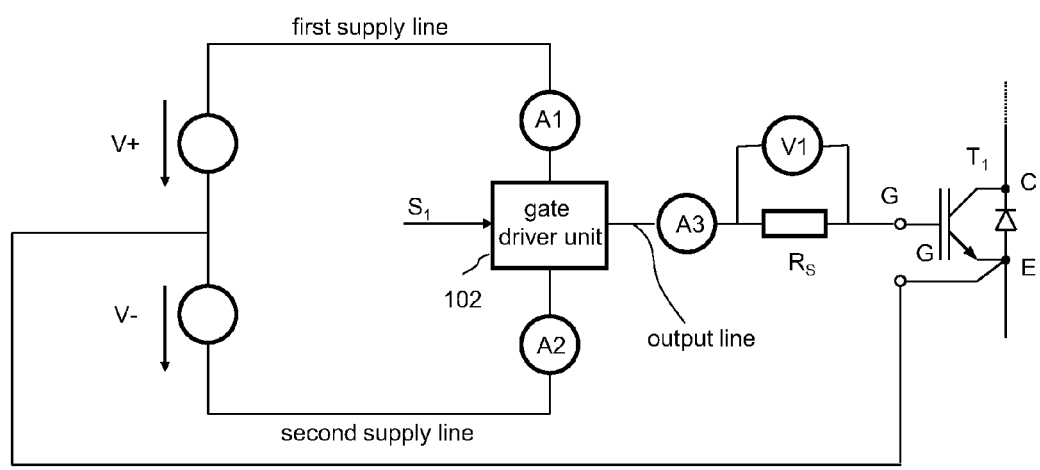
FIG. 4 is a schematic diagram illustrating a variety of options for gate current sensing using a gate driver circuit.

In order to attain the conducting state signal $S_{VR}$, the gate driver unit 102 is configured to be capable of sensing the gate current flowing to and from the gate electrode G of the RC-IGBT. FIG. 4 shows a possible embodiment. Current-measuring devices, for example appropriate ampere meters, can be arranged in the first supply line of the gate driver (device A1), and/or in the second supply line (device A2), and/or in the gate driver output line (device A3), the gate driver output line being sometimes referred to as a gate wire. Conceivably, two or more of the three current-measuring devices may also be arranged in the circuitry. However, only one of the three current measuring devices may be sufficient in many applications.

In accordance with the embodiment illustrated in FIG. 4, a shunt resistance $R_S$ may be connected as a current measuring device between the gate driver unit 102 and the gate electrode of the connected transistor (i.e. the gate resistor is inserted in the gate driver output line). In this case, e.g. a parallel voltage-measuring device V1 may be used to sense the gate current. It is possible to combine one or more of the current-measuring devices or methods for gate current sensing described herein. In accordance with another embodiment, a shunt resistance is arranged in the first (high side) and/or in the second (low side) supply line supplying the gate driver unit 102. Again, the voltage drop across the shunt resistor may be measured, thus obtaining a measurement value representative of the gate current.

A resistance is commonly arranged between the gate G and the output of the gate driver 102. This resistance, usually referred to as gate resistance $R_G$ (not shown), could also be used as a shunt resistor for current sensing instead of an additional shunt resistance $R_S$. Any combination of current-measuring devices and shunt (or gate) resistances may be employed, even if not explicitly referred to herein.

Still referring to FIG. 4, the gate switching unit 102 is shown to be supplied by a voltage source (V+, V−). A current sensing device A1 or A2 may be inserted in the supply lines providing current to the gate driver unit 102. A signal representative of the gate current might be sensed at various positions in gate control circuit 10. Further, current sensing may be performed at more than one position in the same circuitry.

Figure 5:
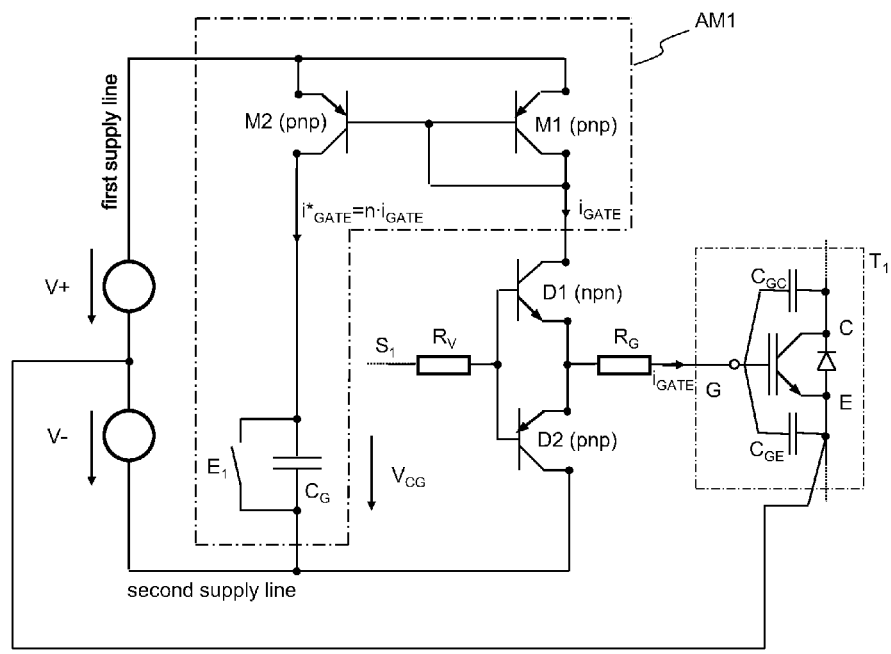
FIG. 5 is a schematic diagram illustrating a circuit arrangement for gate current sensing by means of a current mirror connected to a gate driver circuit.

FIG. 5 illustrates one particular implementation of the current-measuring device A1 of FIG. 4. Some details of the gate switching unit 102 are illustrated in FIG. 5. The gate control signal $S_1$ (if not blanked) is provided to the gate electrodes of an emitter follower stage across a series resistance $R_V$, the emitter follower stage (output stage), for example, formed by the bipolar transistor $D_1$ (which may be an npn-transistor) and the bipolar transistor $D_2$ (which may be a pnp-transistor). Instead of bipolar transistors, any transistor type (e.g. MOSFETs) can be applied for implementation of the emitter follower stage. The emitter follower stage provides the gate current $i_{GATE}$ to the RC-IGBT $T_1$ across the gate control output line (or gate wire). For the purpose of switching speed control (e.g. "edge shaping"), in most cases a gate resistance $R_G$ is placed in the gate wire.

As shown in FIG. 5, the current measuring device can, for example, comprise a current mirror which is formed by the transistors $M_1$ and $M_2$. A capacitance $C_G$ and an electronic switch $E_1$ (e.g. another transistor) connected parallel thereto are coupled to the current mirror such that the mirror current may charge the capacitance $C_G$. The current mirror provides a first current path across transistor $M_1$ and a second current path across transistor $M_2$. The first current path carries the gate current $i_{GATE}$, whereas the second current path carries a mirror current $i_{GATE}^*=n \cdot i_{GATE}$ (where n is usually lower or equal than 1) which is equal or directly proportional to the gate current $i_{GATE}$. Both the gate current $i_{GATE}$ and the mirror current $i_{GATE}^*$ may be provided by the voltage sources V+ and V−.

As described hereinbefore, it is the nature of the RC-IGBT $T_1$ that, upon a sudden change in the voltage across its collector-emitter path (e.g. a $V_{CE}$ voltage peak), the intrinsic parasitic capacitance $C_{GC}$ (and $C_{SE}$) will be charged or discharged, resulting in a corresponding gate current $i_{GATE}$. A discharging of the parasitic gate-collector capacitance $C_{GC}$ is particularly caused by a collector-emitter voltage ($V_{CE}$) dip of a transistor simultaneously passing from a forward blocking into its reverse conducting state, the voltage dip resulting in a displacement current and respective gate current which can be measured in the gate wire (gate supply line). If a gate current $i_{GATE}$ passes through the transistor $M_1$, it will be mirrored by the current mirror such that the sense capacitance $C_G$ will "see" a change of its charge state resulting from the mirror current $i_{GATE}*$. The switch $E_1$ may be used to short-circuit and discharge the capacitance $C_G$. The charge $Q_G$ stored in the capacitance $C_G$ is appropriately monitored using the relation $Q_G=C_G \cdot V_{CG}$, i.e. by measuring the voltage drop $V_{CG}$ across capacitance $C_G$. The appropriate value of capacitance $C_G$ is chosen according to the relation between the currents $i_{GATE}$ and $i_{GATE}*$. Thus, the charge stored in capacitance $C_G$ is a measure of the gate current $i_{GATE}$, the gate current again being a measure of the conducting state of the RC-IGBT. A circuit arrangement, particularly a gate switching circuit, as depicted in FIG. 5 for an RC-IGBT $T_1$, is provided for each RC-IGBT of an inverter half-bridge (as shown in FIG. 1). A detailed description of how the conducting state of the RC-IGBT may be derived from the gate current $i_{GATE}$, that is from the state of charge of the capacitance $C_G$, shall be given in following.

Concerning switch $E_1$, the capacitance $C_G$ is charged by the current $i_{GATE}*$ as long as switch $E_1$ is open. If switch $E_1$ is closed, capacitance $C_G$ will be discharged and a measurement cycle thus initialized. According to one embodiment, the switch $E_1$ may be switched synchronously with the gate control signal $S_1$ of the corresponding RC-IGBT. It is the purpose of the switch $E_1$ to reset the charge state (i.e. initializing step) of the sense capacitance CG prior to the initiation of the sense period, the sense period being the time interval while the RC-IGBT conducting state is determined.

Figure 6:
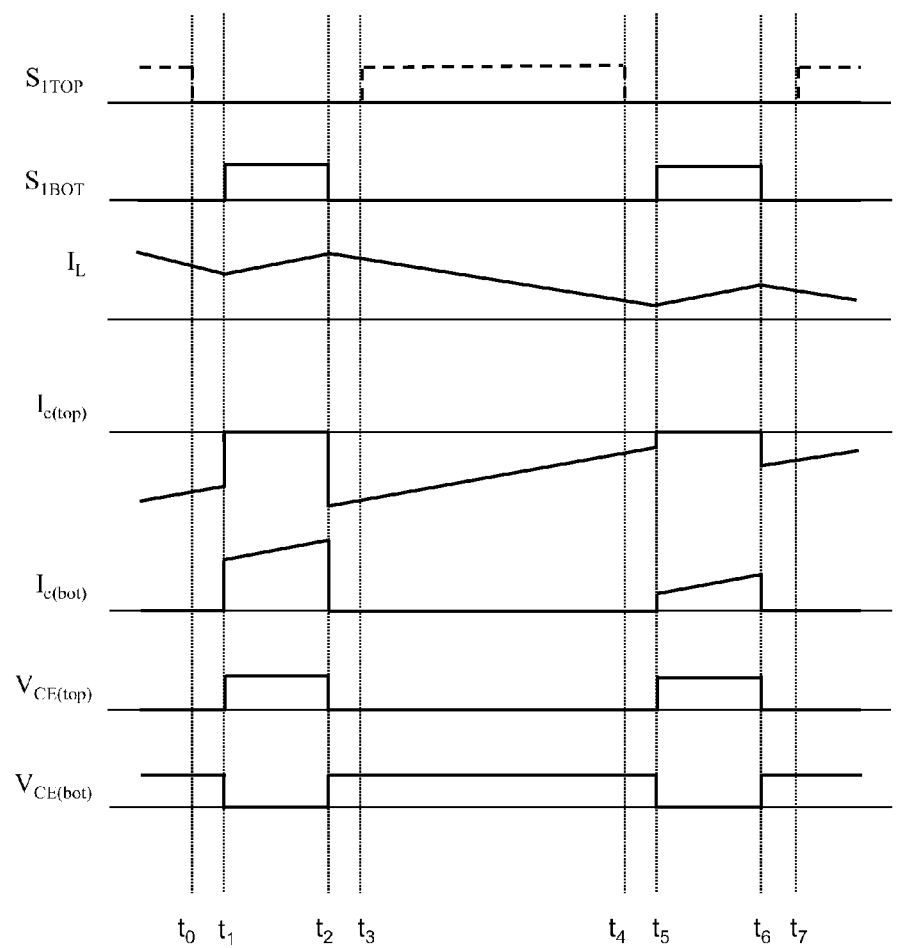
FIG. 6 is a time diagram which shows the time response of control signals, currents, and voltages of the inverter half-bridge in FIG. 1 and the circuit arrangement in FIG. 4 when no zero crossing of the load current occurs.

In FIG. 6 a timing diagram is shown depicting the time response of signals, voltages, and currents in an inverter half-bridge, such as illustrated in FIG. 1, with a gate control unit 10, each half-bridge RC-IGBT ($T_{1BOT}$, $T_{1TOP}$) comprising a gate switching circuit arrangement according to FIG. 5, in which the transistor $T_1$ may be a high side transistor ($T_{1TOP}$) or a low side transistor ($T_{1BOT}$). In case an RC-IGBT conducts in the reverse direction, the logical turn-on signal is blocked and the gate switching unit remains in the off state.

The time responses of the control signals $S_{1BOT}$ and $S_{1TOP}$ are depicted in FIG. 6, where a high-signal means "turn-on transistor" and a low-signal means "turn-off transistor". Assuming a positive load current $I_L$ (referring to the load current direction indicated in FIG. 1), the top transistor $T_{1TOP}$ would be in its reverse conducting state, as soon as the bottom transistor $T_{1BOT}$ is turned off by its control signal $S_{1BOT}$. As the logical turn-on signal $S_{1TOP}$ of transistor $T_{1BOT}$ is blocked and the gate switching unit remains in the off state, the signal $S_{1TOP}$ is shown in a dashed line. The dashed line shows the signal $S_{1TOP}$ as it would be, if it was not blocked. For a negative load current direction $I_L$ (again referring the direction indicated in FIG. 1), the same coherences are valid, but the designator "top" and "bottom" should be exchanged.

It can be seen from FIG. 6 that turning off the bottom transistor $T_{1BOT}$ (i.e. at time instants $t_2$ or $t_6$) initiates the reverse conducting state of the top transistor $T_{1TOP}$. In practice, a dead time or delay time $t_{DELAY}$ between, for example, the time instants $t_2$ to $t_3$ or $t_6$ to $t_7$, is inevitable, meaning that neither control signal, $S_{1TOP}$ or $S_{1BOT}$, is high and that neither transistor, $T_{1TOP}$ or $T_{1BOT}$, is turned on via its gate electrode G, so as to avoid shoot-throughs. At the time instants $t_3$ or $t_7$ the dead time $t_{DELAY}$ has elapsed and the control signal $S_{1TOP}$ of the reverse conducting top transistor $T_{1TOP}$ would switch to a high level if not blocked.

It can further be seen from FIG. 6 that in case of a currently reverse conducting RC-IGBT (in the present case the top transistor $T_{1TOP}$) and an imminent low-high transition of the corresponding control signal (i.e. $S_{1TOP}$), its collector-emitter-voltage $V_{CE(top)}$ is zero. The collector-emitter-voltage $V_{CE(top)}$ goes zero at time instant $t_2$, an instant before the signal $S_{1TOP}$ would normally go high at time instant $t_3$. The voltage across the bottom transistor $V_{CE(bot)}$ is zero, while the transistor $T_{1BOT}$ is conducting. When the signal $S_{1BOT}$ goes to zero at time instant $t_2$, the voltage $V_{CEBOT}$ goes to a high level.

At this moment $t_2$ the positive load current $I_L$ commutates to the top transistor and flows there in reverse direction. For switch $T_{1TOP}$ this transition is a passive commutation because, without changing its gate signal, the device came from forward blocking into reverse conducting state. Therefore, at time instant $t_2$ the passive switching event can be monitored e.g. by means of a monitoring unit of the gate driver in order to block the logical turn-on signal for $T_{1TOP}$ at time instant $t_3$.

In the interval between time instants $t_2$ and $t_6$ the reverse conducting state of $T_{1TOP}$ is blocked and no turn-on action of $T_{1TOP}$ occurs. This information is next updated at time instant $t_6$. In the embodiment of FIG. 6, no zero crossing of the load current $I_L$ takes place. If a zero crossing would happen, for example between time instants $t_2$ and $t_5$ with the signal $S_{1TOP}$ not being blocked, the current would commutate from $T_{1TOP}$ diode into $T_{1TOP}$ IGBT. In this case, with the signal being blocked because the diode was conducting at time instant $t_2$ and therefore no turn-on signal was sent to the IGBT, this results in highly distorted current and voltage waveforms without real zero crossing possible. Those waveforms are shown in FIG. 8.

Figure 8:
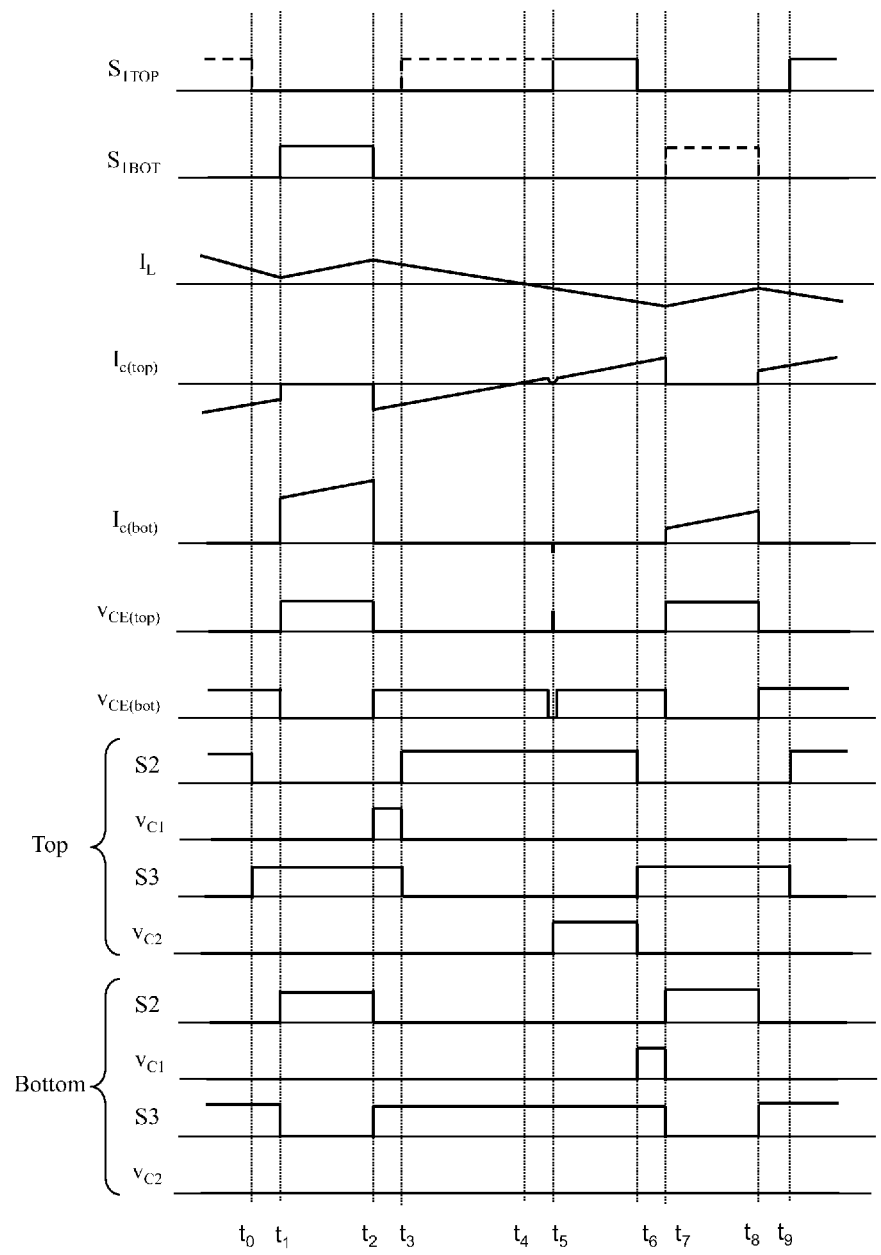
FIG. 8 is a time diagram which shows time response of control signals, currents, and voltages of the circuit arrangement in FIG. 7.

FIG. 8 shows a similar situation as described above. The difference is that the load current $I_L$ at time instant $t_2$ is so low that between time instants $t_2$ and $t_6$ a zero crossing happens. The gate G of the RC-IGBT is switched off. The current $I_L$ through the diode starts decreasing at time instant $t_2$ and at time instant $t_4$ it crosses zero. As the internal diode of transistor $T_{1TOP}$ contains stored carriers even if its current is already zero, the diode is not able to block immediately. Therefore, between time instants $t_4$ and $t_5$ the load current becomes negative but still flows through transistor $T_{1TOP}$. At time instant $t_5$ the stored carriers are fully removed from $T_{1TOP}$ diode and the device can no longer conduct current. The load inductor $L_L$ is by then loaded with a negative current, which then needs to flow through the diode of transistor $T_{1BOT}$ as the current path through the diode of $T_{1TOP}$ is no longer available. Due to this, the voltage $V_{CE(bot)}$ goes down to zero at time instant $t_5$ and causes a sudden collector-emitter voltage $V_{CE(top)}$ rise at transistor $T_{1TOP}$. By detecting this sudden collector-emitter voltage $V_{CE(top)}$ rise, the zero crossing of the load current $I_L$ can also be detected.

Figure 7:
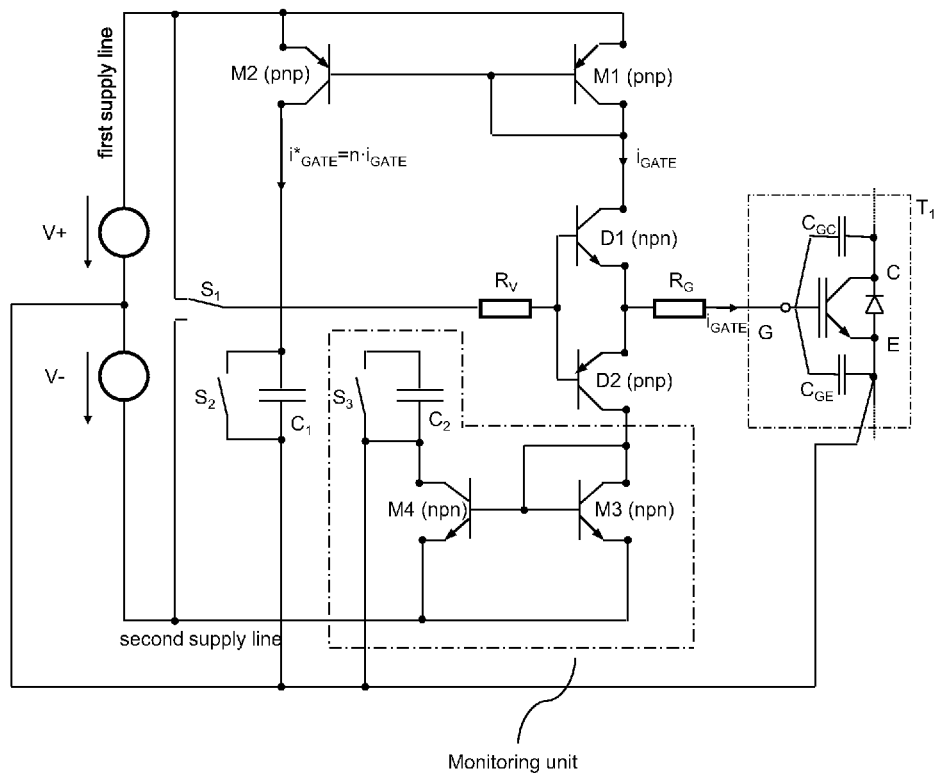
FIG. 7 is a schematic diagram illustrating a circuit arrangement for zero crossing detection.

If the collector-emitter voltage $V_{CE(top)}$ rises, also the collector-gate voltage of transistor $T_{1TOP}$ rises, resulting in a charge current of the parasitic capacitance $C_{CG}$. This current needs to pass the gate driver stage and can be detected by means of a monitoring unit. One embodiment of such a monitoring unit is shown in FIG. 7. The monitoring unit shown in FIG. 7 contains two npn-transistors M3 and M4 forming a current mirror as well as a switch S3 (e.g. another transistor) and a capacitance C2 connected parallel thereto which are coupled to the current mirror. The pnp-transistors M1 and M2 as well as the switch S2 and capacitance C1 which are also shown in the circuit of FIG. 7, but are not part of the monitoring unit, are responsible for detecting the reverse current flow.

In FIG. 8 the operation of switches S2 and S3 as well as the voltages across capacitances C1 and C2, voltages $v_{C1}$ and $v_{C2}$ are also illustrated for both the top and bottom gate driver unit to further explain the operation of the monitoring unit shown in FIG. 7. The switches S2 and S3 are controlled by means of the original control signal for the top and bottom side, respectively. A logical "1" means, that the corresponding switch is closed, whereas a logical "0" means that the switch is open. If switch S2 is open, switch S3 is closed and vice versa. At time instant $t_3$ the top switch S3 is opened allowing a voltage across the paralleled capacitance C2. As described above, at time instant $t_5$ transistor $T_{1TOP}$ becomes blocking and a positive gate current is fed into the gate. This current passes the transistors D2 and M3. Transistor M3 is part of the current mirror, which mirrors the gate current by means of transistor M4. This mirrored current flows through capacitance C2 and causes a voltage hub across capacitance C2 at time instant $t_5$.

In the given embodiment, the voltage rise at capacitance C2 is the signal which causes the turn-on of transistor $T_{1TOP}$. This is done by switching the signal $S_{1TOP}$ from 0 to 1. At time instant $t_6$ the switch S3 is closed and the voltage at capacitance C2 is forced to zero. At this point the circuit is prepared for a new period.

During the next period between time instants $t_6$ and $t_9$, which is also shown in FIG. 8, the load current is negative. Assuming this negative load current $I_L$ (referring to the load current direction indicated in FIG. 1), the bottom transistor $T_{1BOT}$ would be in its reverse conducting state, as soon as the top transistor $T_{1TOP}$ is turned off by its control signal $S_{1TOP}$. As the logical turn-on signal $S_{1BOT}$ of transistor $T_{1BOT}$ is blocked and the gate driver remains in off state, the signal $S_{1BOT}$ as it would be without blocking, is shown again in a dashed line. During this period between time instants $t_6$ and $t_9$ no zero crossing of the load current $I_L$ occurs.

Those skilled in the art will readily recognize that the arrangement of FIG. 7, which has been described above, is just one embodiment of an implementation of a monitoring unit which can be used to detect the sudden collector-emitter voltage $V_{CE(top)}$ rise, and therefore the zero crossing of the load current $I_L$.

Figure 9:
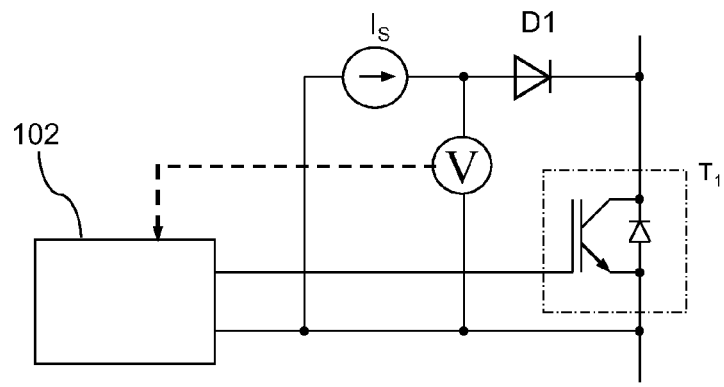
FIG. 9 is a schematic diagram illustrating another circuit arrangement for zero crossing detection.

In FIG. 9, a further embodiment of a monitoring unit is shown. Instead of a current mirror, a monitoring unit is shown, which includes a current source $I_S$ and a diode D1 connected electrically parallel to the collector-emitter path of transistor $T_1$. A hub of the collector-emitter voltage $V_{CE(top)}$ can be detected using a voltage measurement device V. With its output, the voltage measurement device V is connected to the emitter of the transistor. With its input, the voltage measurement device V is connected to the connection point of the current source $I_S$ and the diode D1.

Figure 10:
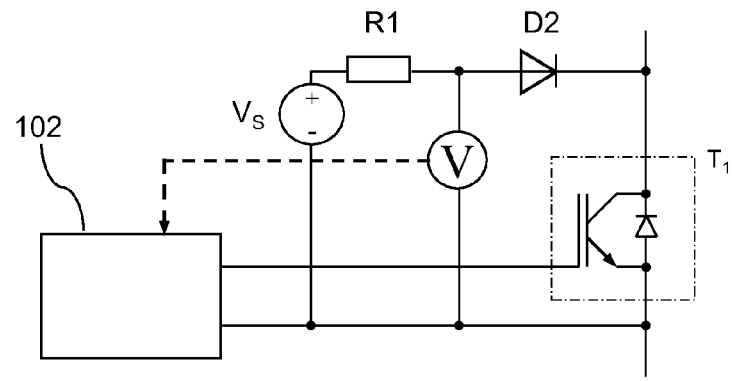
FIG. 10 is a schematic diagram illustrating another circuit arrangement for zero crossing detection.
Figure 11:
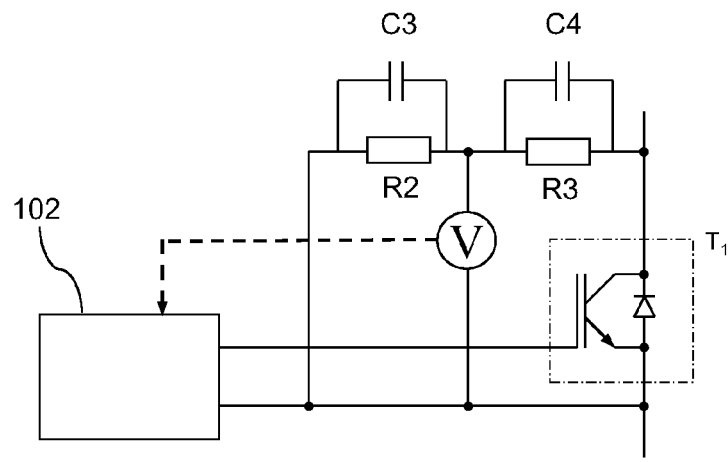
FIG. 11 is a schematic diagram illustrating another circuit arrangement for zero crossing detection.

Further embodiments for the implementation of a monitoring unit are shown in FIGS. 10 and 11. In FIG. 10 the arrangement includes a voltage source $V_S$, a resistor R1 and a diode D2 connected electrically parallel to the collector-emitter path of transistor $T_1$. A voltage measurement device V is connected to the emitter of the transistor with its output and with its input it is connected to the connection point of the resistor R1 and the diode D2. The arrangement in FIG. 11 includes a frequency-compensated voltage divider which includes two resistors R2 and R3 connected electrically parallel to the collector-emitter path of transistor $T_1$. Each resistor R2, R3 has a capacitance C3, C4 connected in parallel. One output of the voltage divider is connected to the input of the voltage measurement device V. On its output the voltage measurement device V is connected to the emitter of the transistor. The connection point of the two resistors R2 and R3 represents the output of the voltage divider. In each embodiment, the gate switching unit 102 is connected between the gate and emitter of the transistor $T_1$. The voltage divider shown in FIG. 11 includes two resistors R2 and R3, but is not restricted to this number. It is also possible to implement a frequency-compensated voltage divider with two or even more resistors, each resistor having a capacitance connected in parallel.

Figure 12:
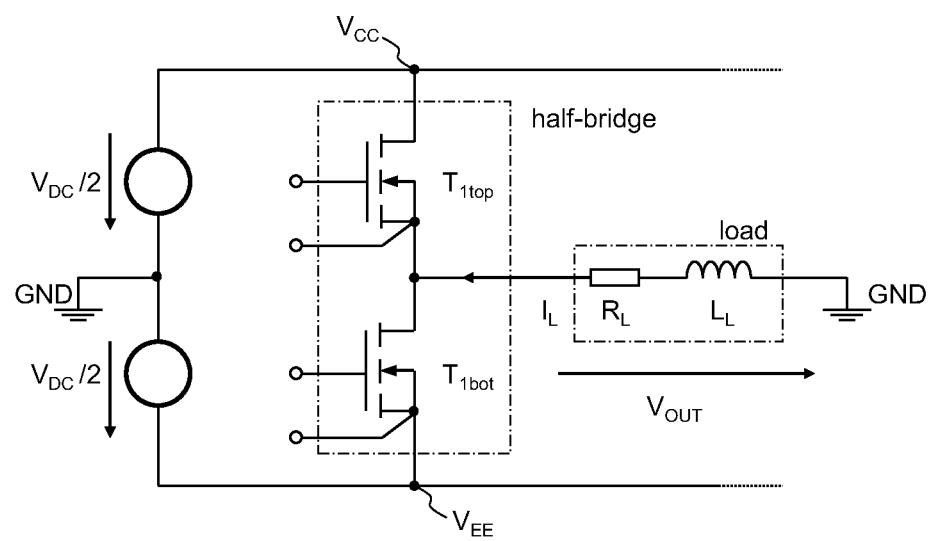
FIG. 12 is a schematic diagram illustrating a field-effect transistor half-bridge circuit arrangement connected to a load impedance including an inductor.

As already stated above, the disclosed circuit arrangements according to the present invention may also be used for any other transistor type, e.g. field-effect transistor, and are not limited to IGBTs. FIG. 12 shows the half-bridge as illustrated in FIG. 1, using field-effect transistors $T_{1top}$ and $T_{1bot}$ instead of IGBTs. Also, in the circuit arrangements disclosed within FIGS. 2 to 11, field-effect transistors may be used instead of IGBTs.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement, comprising:
   a reverse conducting transistor having a gate electrode and a load current path between an emitter and collector electrode, the transistor configured to allow for conducting a load current in a forward direction and in a reverse direction through the load current path and to be activated or deactivated by a respective signal at the gate electrode;
   a gate control unit connected to the gate electrode and configured to deactivate the transistor or to prevent an activation of the transistor via the gate electrode when the transistor is in a reverse conducting state; and
   a monitoring unit configured to detect a sudden rise of a collector-emitter voltage of the reverse conducting transistor which occurs shortly after the load current crosses zero while the transistor is deactivated or activation is prevented by the gate control unit, and wherein the monitoring unit is further configured to generate a signal which forces the transistor to turn on when the monitoring unit detects the sudden rise of the collector-emitter voltage.

2. The circuit arrangement according to claim 1, wherein the sudden rise of the collector-emitter voltage results in a gate current at the gate electrode of the reverse conducting transistor and the monitoring unit generates the signal which forces the transistor to turn on from the gate current.

3. The circuit arrangement according to claim 1, wherein the monitoring unit is supplied by a voltage source.

4. The circuit arrangement according to claim 1, wherein the monitoring unit comprises a current minor.

5. The circuit arrangement according to claim 4, wherein:
   the current mirror comprises a first and a second current path;
   the current mirror is arranged such that the current in the first path is derived from the gate current; and the current mirror is configured such that the current in the second path is equal or directly proportional to the current in the first current path.

6. The circuit arrangement according to claim 5, wherein:
a switch is arranged in the second current path of the current mirror;
a capacitance is arranged in the second current path of the current mirror in parallel to the switch to be charged by the current flowing in the second current path of the current mirror when the switch is open.

7. The circuit arrangement according to claim 1, wherein the monitoring unit comprises a current source and a diode.

8. The circuit arrangement according to claim 1, wherein the monitoring unit comprises a voltage source, a resistor and a diode.

9. The circuit arrangement according to claim 1, wherein the monitoring unit comprises a frequency-compensated voltage divider.

10. A method of detecting a zero crossing of a load current of a reverse conducting transistor having a gate electrode and a load current path between an emitter and collector electrode, the method comprising detecting a sudden rise of a collector-emitter voltage of the reverse conducting transistor which occurs shortly after the load current crosses zero while the transistor is in a reverse conducting state and is deactivated or activation is prevented by a respective signal at the gate electrode and generating a signal which forces the transistor to turn on when the sudden rise of the collector-emitter voltage is detected.

11. The method according to claim 10, further comprising causing a voltage hub in a capacitance which is part of a monitoring unit connected to the reverse conducting transistor.

12. The method according to claim 11, further comprising activating the reverse conducting transistor responsive to the voltage hub in the capacitance.

13. A circuit arrangement, comprising:
a half-bridge switching circuit comprising two reverse conducting transistors configured to allow for conducting a load current in a forward direction and in a reverse direction, the transistors having a load current path and a gate electrode and a common circuit node of the two transistors being a half-bridge output configured to provide an output current;
a gate control unit for each transistor that is connected to the respective gate electrode and configured to deactivate the respective transistor or to prevent an activation of the transistor via the corresponding gate electrode when the transistor is in a reverse conducting state;
a monitoring unit for at least one of the transistors that is connected to the respective gate control unit and configured to detect a sudden rise of a collector-emitter voltage of the reverse conducting transistor which occurs shortly after the load current crosses zero while the transistor is deactivated or deactivation is prevented by the gate control unit and wherein the monitoring unit is further configured to generate a signal which forces the transistor to turn on when the monitoring unit detects the sudden rise of the collector-emitter voltage.

* * * * *

UNITED STATES PATENT AND TRADEMARK OFFICE
CERTIFICATE OF CORRECTION

PATENT NO. : 8,471,600 B2
APPLICATION NO. : 13/249604
DATED : June 25, 2013
INVENTOR(S) : D. Domes Page 1 of 1

It is certified that error appears in the above-identified patent and that said Letters Patent is hereby corrected as shown below:

In the Claims:

Column 10, line 62 (claim 4, line 2) of the printed patent, please change "minor" to -- mirror --

Signed and Sealed this
Twenty-fifth Day of February, 2014

Michelle K. Lee
*Deputy Director of the United States Patent and Trademark Office*